United States Patent
Siriani et al.

(10) Patent No.: US 11,245,250 B2
(45) Date of Patent: Feb. 8, 2022

(54) QUANTUM DOT COMB LASER

(71) Applicant: Cisco Technology, Inc., San Jose, CA (US)

(72) Inventors: Dominic F. Siriani, Lansdale, PA (US); Vipulkumar K. Patel, Breinigsville, PA (US)

(73) Assignee: Cisco Technology, Inc., San Jose, CA (US)

(*) Notice: Subject to any disclaimer, the term of this patent is extended or adjusted under 35 U.S.C. 154(b) by 89 days.

(21) Appl. No.: 16/853,457

(22) Filed: Apr. 20, 2020

(65) Prior Publication Data

US 2021/0328409 A1 Oct. 21, 2021

(51) Int. Cl.
| | |
|---|---|
| *H01S 5/34* | (2006.01) |
| *H01S 5/10* | (2021.01) |
| *H01S 5/042* | (2006.01) |
| *H01S 5/028* | (2006.01) |
| *H01S 5/12* | (2021.01) |

(52) U.S. Cl.
CPC .......... *H01S 5/3412* (2013.01); *H01S 5/028* (2013.01); *H01S 5/042* (2013.01); *H01S 5/1014* (2013.01); *H01S 5/1234* (2013.01)

(58) Field of Classification Search
CPC ........ H01S 5/1014; H01S 5/1234; H01S 5/10; H01S 5/3412; H01S 5/1064; H01S 5/142; H01S 5/34
USPC .......................................... 385/2; 372/50.22
See application file for complete search history.

(56) References Cited

U.S. PATENT DOCUMENTS

| | | | |
|---|---|---|---|
| 5,644,667 A | 7/1997 | Tabuchi | |
| 7,573,926 B2 | 8/2009 | Lin et al. | |
| 7,769,062 B2 | 8/2010 | Lu et al. | |
| 9,559,497 B2 | 1/2017 | Lell et al. | |
| 10,461,495 B2 | 10/2019 | Siriani et al. | |
| 2005/0053319 A1 | 3/2005 | Doan | |
| 2008/0291952 A1* | 11/2008 | Yamamoto | H01S 5/0265 372/26 |
| 2010/0265980 A1* | 10/2010 | Matsuda | B82Y 20/00 372/46.01 |
| 2013/0015546 A1 | 1/2013 | Joe et al. | |
| 2013/0189804 A1 | 7/2013 | Marchena | |
| 2013/0309801 A1 | 11/2013 | Hsiao et al. | |
| 2015/0010266 A1 | 1/2015 | Webster et al. | |

(Continued)

OTHER PUBLICATIONS

Chen et al., "Electrically pumped continuous-wave 1.3 ?m InAs/GaAs quantum dot lasers monolithically grown on on-axis Si (001) substrates," Optics Express, vol. 25, No. 5, Mar. 6, 2017, 8 pages.

(Continued)

*Primary Examiner* — Tuan N Nguyen (74) *Attorney, Agent, or Firm* — Patterson + Sheridan, LLP (57) ABSTRACT

A quantum dot comb laser, is provided that comprises a first waveguide having a first width; and a second waveguide running above the first waveguide that includes: a quantum dot layer; a first region of a second width less than the first width; a second region connected to the first region and comprising a reflective grating; and a third region connected at a first end to the second region and at a second end to an output surface wherein the third region tapers from the second width at the first end to a third width, less than the second width, at the second end.

20 Claims, 9 Drawing Sheets

(56) References Cited

U.S. PATENT DOCUMENTS

| | | |
|---|---|---|
| 2015/0153524 A1 | 6/2015 | Chen |
| 2017/0084595 A1 | 3/2017 | Seddon et al. |
| 2017/0139142 A1 | 5/2017 | Patel et al. |
| 2017/0207600 A1 | 7/2017 | Klamkin et al. |
| 2019/0273356 A1 | 9/2019 | Siriani et al. |
| 2019/0273364 A1 | 9/2019 | Siriani et al. |
| 2020/0067273 A1 | 2/2020 | Kurczveil et al. |

OTHER PUBLICATIONS

Wang et al., "1.3-?m InAs/GaAs quantum-dot lasers monolithically grown on Si substrates," 2011 Optical Society of America, 6 pages.

Norman et al, "Electrically pumped continuous wave quantum dot lasers epitaxially grown on patterned, on-axis (001) Si," Optics Express, vol. 25, No. 4, Feb. 20, 2017, 8 pages.

Liu et al., "Electrically Pumped Continuous-wave 1.3 quantum-dot lasers epitaxially grown on on-axis (001) GaP/Si," Dec. 12, 2016, Optics Letters, 6 pages.

Akiyama et al. "A Novel Transmitter Leveraging High-Speed Ultralow-Power Modulation of a Si Microring Modulator by Eliminating Tuning Power," 2016 Optical Fiber Communications Conference and Exhibition, Mar. 20, 2016. Abstract Only.

Sacher, et al. "High-speed laser modulation beyond the relaxation resonance frequency limit" Mar. 22, 2010, Optics Express, vol. 18, No. 7, 8 pages.

Dong, et al., "Directly Reflectivity Modulated Laser" Jan. 27, 2018, J. of Lightwave Tech., vol. 36, Issue 5, 6 pages. Abstract Only.

Plant et al., "250 mW, 1.5 um, monolithic passively mode-locked slab-coupled optical waveguide laser," Optics Letters, 31, 223-225, 2006 [Abstract Only].

Yin et al., "Laser diode comb spectrum amplification preserving low RIN for WDM applications," 2009 Asia Communications and Photonics Conference and Exhibition (ACP), Shanghai, 2009 [Abstract Only].

Joshi et al., "Quantum dash based single section mode locked lasers for photonic integrated circuits," Optics Express, 22, 11254-11266, 2014.

Gubenko et al., "Quantum dot comb laser with the integrated DBR section for DWDM optical interconnects," 2013 Optical Fiber Communication Conference and Exposition and the National Fiber Optic Engineers Conference (OFC/NFOEC), Anaheim, CA, 2013.

U.S. Appl. No. 16/751,994, "Optical Waveguide Emitter with Turning Waveguide Section," filed Jan. 24, 2020.

\* cited by examiner

QUANTUM DOT COMB LASER

TECHNICAL FIELD

Embodiments presented in this disclosure generally relate to lasers. More specifically, embodiments disclosed herein relate to generating comb lasers via quantum dots.

BACKGROUND

Lasers are an integral part of the modern telecommunications landscape, and as demand for telecommunications services increases, providers are seeking to use existing transmissions media (such as fiber optic cables) as efficiently as possible. Wavelength Division Multiplexing (WDM) is one such solution, in which several beams of light having different wavelengths are transmitted over a shared cable, which allows for greater data rates (and/or bidirectional transmission) than using that same cable with a single beam of light. Dense WDM (DWDM) and related standards seek to use the transmission medium with several densely packed wavelengths, which requires precise beamforming so that the signals carried on one wavelength in a shared transmission medium do not interfere with another signal carried on a different wavelength.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

One embodiment presented in this disclosure is a quantum dot laser, comprising: a first waveguide having a first width; and a second waveguide running above the first waveguide that includes: a quantum dot layer; a first region of a second width less than the first width; a second region connected to the first region and comprising a reflective grating; and a third region connected at a first end to the second region and at a second end to an output surface wherein the third region tapers from the second width at the first end to a third width, less than the second width, at the second end.

One embodiment presented in this disclosure is a device, including: a first waveguide; an etalon positioned above the first waveguide, the etalon having a first reflective surface and a second reflective surface, wherein the second reflective surface comprises a reflective grating configured to allow a portion of a beam of light produced by quantum dots in the etalon to pass out of the etalon at a first optical spot size, wherein the beam of light includes a plurality of wavelengths with a predefined interval between wavelengths; and a tapered waveguide positioned above the first waveguide and connected to the reflective grating on a first end and to an output surface on a second end, wherein the tapered waveguide is configured to amplify the beam of light received from the etalon via quantum dots included in the tapered waveguide and to direct the beam of light into the first waveguide to pass out of the output surface at a second optical spot size greater than the first optical spot size.

One embodiment presented in this disclosure is a method, comprising: generating a laser beam having a first optical spot size via a plurality of quantum dots in a Fabry-Perot Resonator (FPR), the laser beam including a plurality of wavelengths substantially evenly separated from adjacent wavelengths of the plurality of wavelengths; amplifying the laser beam via a tapered Semiconductor Optical Amplifier (SOA) connected to the FPR via a reflective grating; directing the laser beam from the SOA to a waveguide disposed under the FPR and the SOA, wherein the laser beam expands from the first optical spot size to a second optical spot size; and outputting the laser beam as amplified and at the second optical spot size.

Example Embodiments

The present disclosure provides a comb laser that uses quantum dots to produce a laser beam with configurable gain, wavelength spacing, and optical spot size. Comb lasers produce laser beams that include several discrete wavelengths of light that are equally spaced from one another (i.e., every peak in the spectrum of the laser beam is separated by X Hertz from neighboring peaks), which can be advantageous in WDM embodiments that rely on well-defined separation between wavelengths. The present comb laser also advantageously provides for larger optical spot sizes (that can be tuned by a fabricator to a desired size) and higher optical power than prior comb lasers in a monolithic package, which simplifies fabrication, test, and deployment in a range of applications. The described comb laser combines a quantum dot comb laser in a single package with a Semiconductor Optical Amplifier (SOA) which can provide optical spot sizes of at least 4-5 μm (micrometers) and power levels up to at least 100 mW (milliwatts) that include several wavelengths of light in a single laser beam.

The comb laser described in the present disclosure includes an upper waveguide that is divided into several sections, which produces and amplifies a single laser beam, and directs the laser beam into a lower (and larger) waveguide to output the laser beam with a larger beam size. The upper waveguide includes a layer of quantum dots, and is smaller (less tall and/or less wide) than the lower waveguide.

The laser beam is initially produced in a high-gain region of the upper waveguide and travels through a Distributed Bragg Reflector (also called a DBR or DBR mirror) in a second region and then through a third tapered region before exiting the laser. The first and second region can also be called a Fabry-Perot Resonator (FPR) or an etalon, and the third region can also be called a tapered or a Semiconductor Optical Amplifier (SOA) region. The tapered region can include a physical tapering of the upper waveguide, in which (in some cases) a width of the upper waveguide decreases from an upstream end to a downstream end or (in other cases) the tapered region incorporates various features to change the refractive index of the upper waveguide. The tapering causes light generated in the quantum dots located in the upper waveguide to be pushed into the lower waveguide and to expand in cross-sectional area (e.g., from a first optical spot size to a larger second optical spot size) while the optical signal strength is amplified.

Quantum dots offer several advantages and challenges in comparison to quantum wells or quantum dashes. Accordingly, one of skill in the art will appreciate that solutions appropriate for quantum dots may be inappropriate for solutions using quantum dashes or quantum wells and vice versa. For example, lasers based off of quantum wells often have limited operating temperature ranges, greater back-reflection sensitivity, and limited gain bandwidth when compared to lasers based off of quantum dots.

Figure 1A:
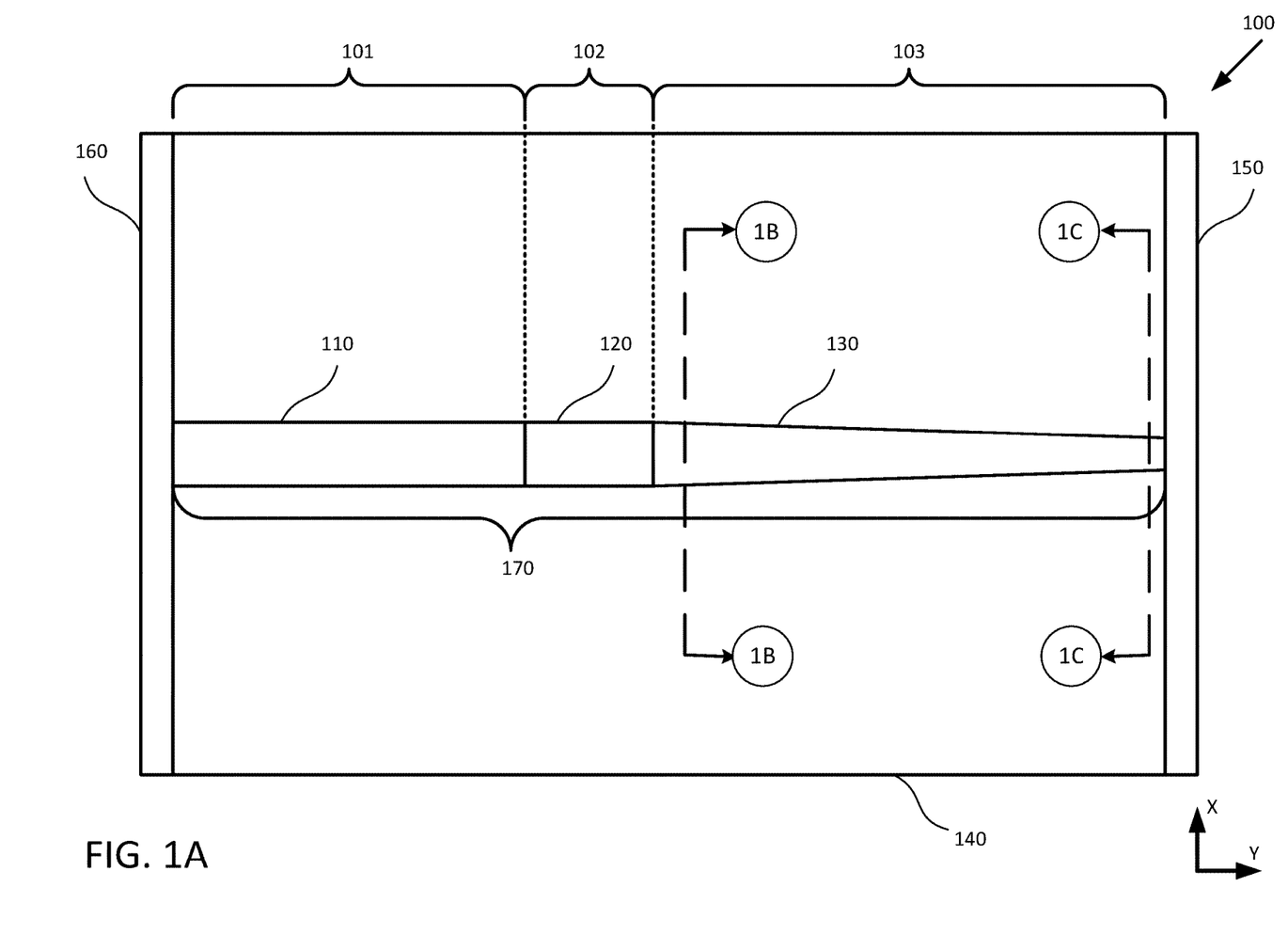
FIGS. 1A-1C illustrate several views of a comb laser, according to embodiments of the present disclosure.
Figure 1B:
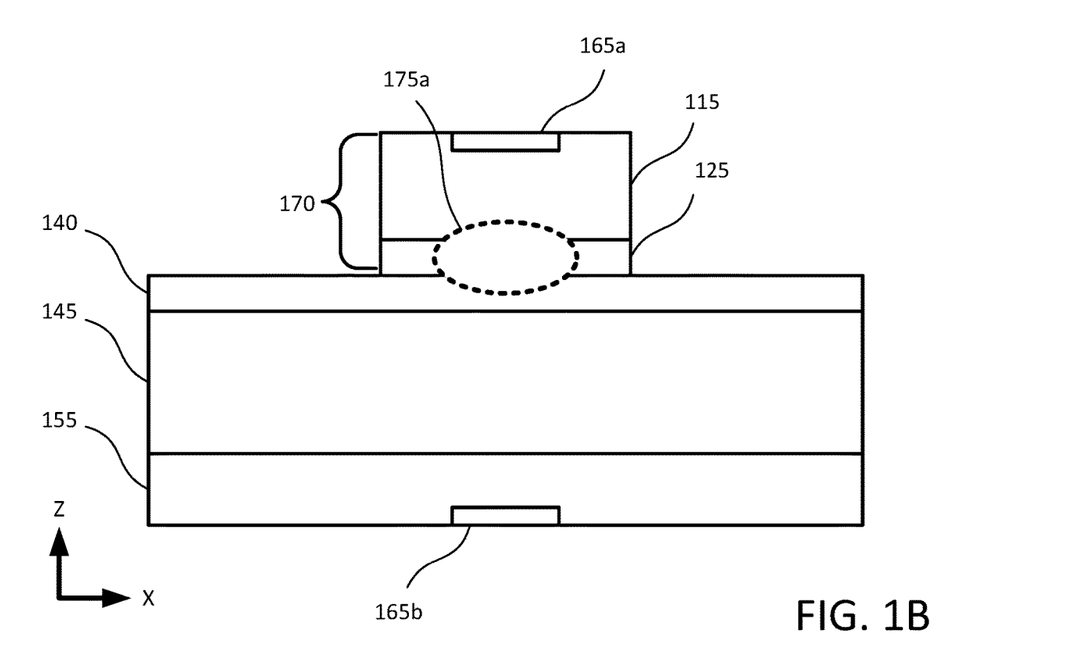
Figure 1C:
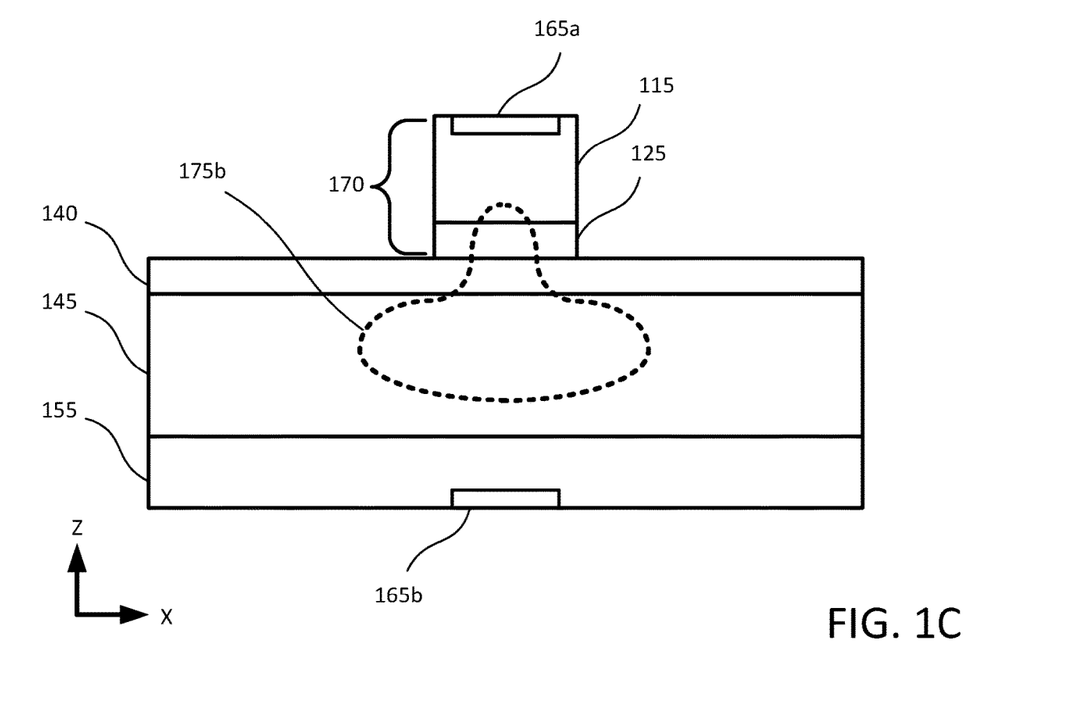

FIGS. 1A-1C illustrate several views of a comb laser 100, according to embodiments of the present disclosure. FIG. 1A illustrates a top-view of the comb laser 100, while FIGS. 1B and 1C illustrate cross-sectional views of the tapered waveguide 130 of the comb laser 100 at the respective cross-sectional lines shown in FIG. 1A.

The comb laser 100 includes a Fabry-Perot (FP) region 101 that includes a high gain laser source 110, a Distributed Bragg Reflector (DBR) region 102 that includes a reflective grating 120, and a Semiconductor Optical Amplifier (SOA) region that includes a tapered waveguide 130. The laser source 110, reflective grating 120, and tapered waveguide 130 collectively form a ridge waveguide 170, that extends upward from a spacer layer 140, which separates the ridge waveguide 170 from a lower waveguide (not illustrated in FIG. 1A). The ridge waveguide 170 includes an active gain medium with a quantum dot layer distributed therein. When an electrical current is applied to the active gain medium, the quantum dots produce a laser beam that includes several defined wavelengths of light, which are substantially evenly spaced by wavelength from one another (e.g., within a +/−10% difference in spacing). The laser beam exits the comb laser via an output surface 150, which can include various antireflective surface treatments to aid in the transmission of the laser beam from the comb laser 100. The comb laser 100 includes a rear surface 160 (opposite to the output surface 150), which can include various reflective coatings, antireflective coatings, or no coating in various embodiments.

In FIG. 1A, the laser source 110, the reflective grating 120, and the rear surface 160 collectively form an etalon (also referred to as a Fabry-Perot Resonator (FPR)), in which light generated by the laser source 110 is reflected between the reflective grating 120 and a high-reflectivity coating on the rear surface 160. The laser source 110 is a quantum dot laser that is generally forward biased to create optical gain and produce a laser beam that exits the laser source 110, travels through the reflective grating 120, and the tapered waveguide 130 to exit the comb laser 100 via the output surface 150. However, some of the light generated by the laser source 110 is reflected back into the laser source 110 from the reflective grating 120, and resonates between the reflective grating 120 and the reflective coating on the rear surface 160. Depending on the length (e.g., in the Y direction) of the laser source 110, and how the reflective grating 120 in tuned, the bandwidth of the laser beam produced and how far apart the peak wavelengths are separated from one another can be controlled. In various embodiments, the reflectivity of the reflective grating 120 can be actively tuned via current injection through the quantum dots included in the reflective grating 120.

The tapered waveguide 130 is positioned downstream of the reflective grating 120, and runs from the reflective grating 120 to the output surface. The tapered waveguide 130, like the laser source 110 and the reflective grating 120, includes quantum dots, which are controlled to amplify the laser beam. Additionally, a fabricator can tune the size and composition of the tapered waveguide 130 to direct the laser beam generated in and propagating through the ridge waveguide 170 into a lower waveguide under the spacer layer 140. In various embodiments, the spacer layer 140 is made of a III-V material having a lower refractive index than either of the ridge waveguide 170 or the lower waveguide. Generally, as the tapered waveguide 130 tapers (i.e., along the length of the tapered waveguide 130 in the downstream direction), optical gain reduces and power increases.

FIG. 1B illustrates a first cross-sectional view of the comb laser 100 (e.g., in the ZX plane, rather than the XY plane of FIG. 1A), and FIG. 1C illustrates a second cross-sectional view of the comb laser 100, downstream from the view illustrated in FIG. 1B. In cross-sectional view, an upper cladding layer 115 of the ridge waveguide 170 is shown to be located above the active gain medium 125. In various embodiments, the upper cladding layer 115 can extend across the spacer layer 140. Included in the upper cladding layer 115 is a first contact 165a (generally or collectively, contact 165), which is paired with a second contact 165b included in a lower cladding layer 155. The upper cladding layer 115 and the lower cladding layer 155 can be formed using various semiconductor or dielectric materials.

The active gain medium 125 is located between the upper cladding layer 115 and the spacer layer 140, and when an electrical charge is injected across the first contact 165a and the second contact 165b, generates or amplifies the laser beam. The active gain medium 125 can include various III-V materials which include a material selected from the Boron group (i.e., a group III material: Boron, Aluminum, Gallium, Indium, Thallium) and a material selected from the Nitrogen group (i.e., a group V material: Nitrogen, Phosphorus, Arsenic, Antimony, Bismuth), such as, for example: Boron-Nitride (BN), Gallium-Nitride (GaN), Gallium-Arsenide (GaAs), and Indium-Phosphide (InP) or alloys thereof including AlGaAs, InGaAs, InGaP, or InGaAsP.

In FIG. 1B, the laser beam has a first optical spot size 175a, and is generally confined to the active gain medium 125. In FIG. 1C, the laser beam has a second optical spot size 175b, which is larger than the first optical spot size 175a, and is no longer confined to the active gain medium 125. Instead, as the tapered waveguide 130 tapers, the laser beam is directed across the spacer layer 140 into the lower waveguide 145 from the active gain medium 125, where the size of the laser beam increases. In some embodiments, the tapered waveguide 130 physically tapers, having a larger width at an upstream end than at a downstream end. In some embodiments, the tapered waveguide 130 optically tapers, having an optical index that becomes increasingly less transmissive downstream from the reflective grating 120. In some embodiments, the tapered waveguide 130 both physically and optically tapers.

The paired contacts 165a and 165b are representative of one or more pairs of contacts 165 across various portions of the comb laser 100. For example, the first contact 165a can be a member of a first plurality of contacts of a plurality of p-n junctions, and the second contact 165b can be a member of corresponding second plurality of contacts for the plurality of p-n junctions. Each region 101-103 of the comb laser 100 can include one or more pairs of electrical contacts 165 to allow for controllable electrical charge to be placed across a portion of the intervening active gain medium 125 to enable the control and configuration of the comb laser 100. In various embodiments, the individual contacts 165 of the respective plurality of contacts are segmented from one another via etching and/or H+ implantation to isolate adjacent contacts from one another.

In various embodiments, one or more pairs of contacts 165 are placed across the active gain medium 125 in the Fabry-Perot region 101 to allow for forward biasing (e.g., to create optical gain), reverse biasing or zero biasing (e.g., to create a saturable absorber region for mode-locking), and/or controlling phase of the laser beam (e.g., via carrier injection or a thermal phase shifter).

In various embodiments, one or more pairs of contacts 165 are placed across the active gain medium 125 in the DBR region 102 to allow for tuning of the reflectivity spectrum of the reflective grating 120.

In various embodiments, one or more pairs of contacts 165 are placed across the SOA region 103 to allow for independent adjustments of the gain within different portions of the tapered waveguide 130, and thus optimizing the changes in gain across the length of the SOA region 103.

Although not illustrated, in some embodiments, the first contacts 165a and the second contacts 165b can be located on the same surface (e.g., the upper surface of the upper cladding layer 115 or the bottom surface of the lower cladding layer 155) and can be placed in electrical contact on opposing sides of the active gain medium 125 via Through Silicon Vias (TSVs) or other internal traces.

Figure 2:
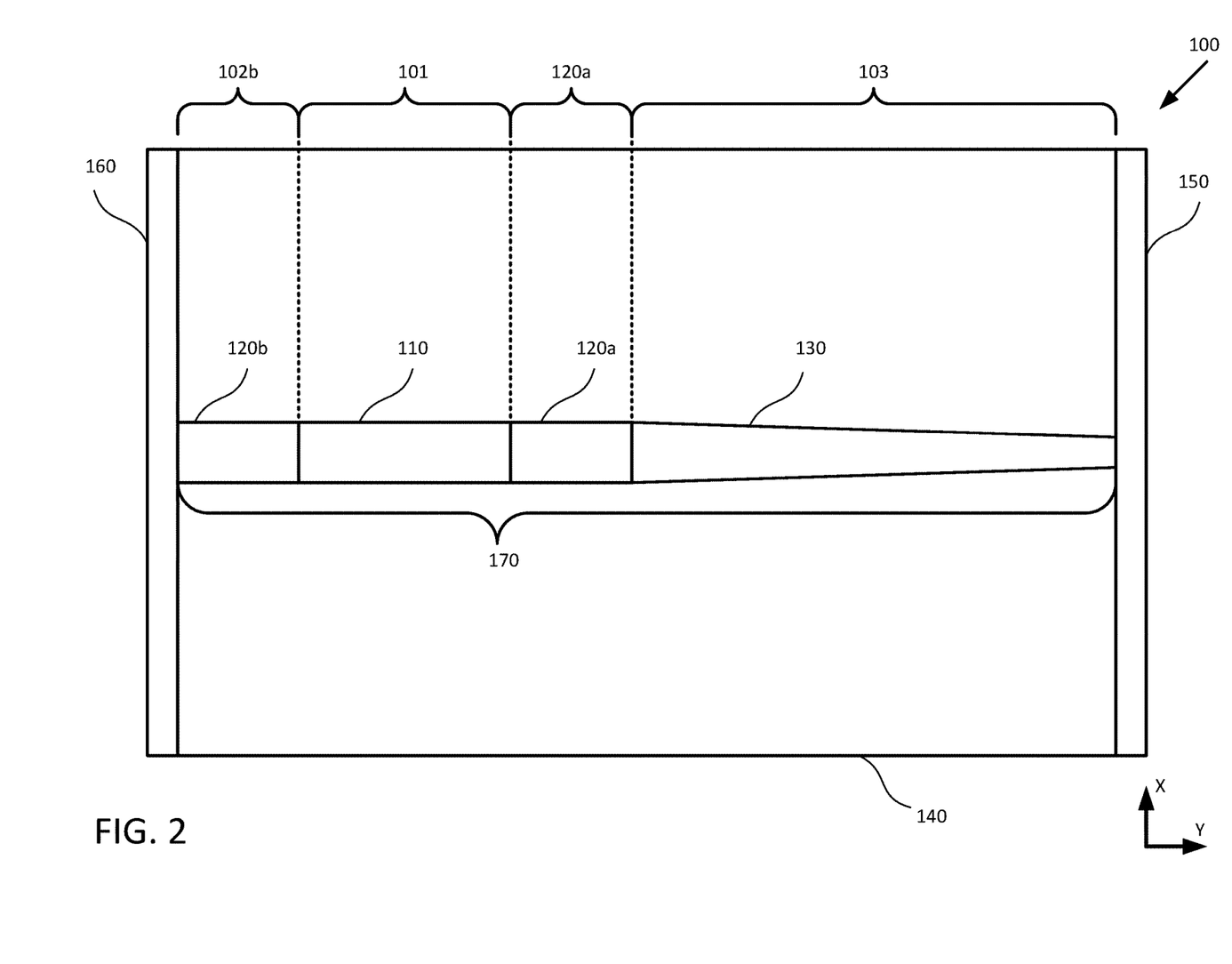
FIG. 2 illustrates a top view of a comb laser including a second reflective grating, according to embodiments of the present disclosure.

FIG. 2 illustrates a top view of a comb laser 100 including two DBR regions 102, according to embodiments of the present disclosure. In the illustrated comb laser 100, a first DBR region 102a is located downstream of the laser source 110, and a second DBR region 102b is located upstream of the laser source 110. The first DBR region 102a includes a first reflective grating 120a providing a downstream reflective surface for the device, and the second DBR region 102b includes a second reflective grating 120b that provides an upstream reflective surface for the device. Both the first reflective grating 120a and the second reflective grating 120b include an active gain medium including quantum dots, but each can be tuned (e.g., via one or more of size, component layout, and amount electrical current injected) independently of one another.

In embodiments that include a second DBR region 102b, the etalon includes the first reflective grating 120a, the laser source 110, the second reflective grating 120b, and (optionally) the rear surface 160. The second reflective grating 120b provides an operator with additional options for bandwidth or reflectivity control in the FPR, via selective current injection through the associated contacts. In various embodiments, the rear surface 160 can include a highly-reflective coating or an anti-reflective coating, or can be provided as an uncoated facet.

Figure 3:
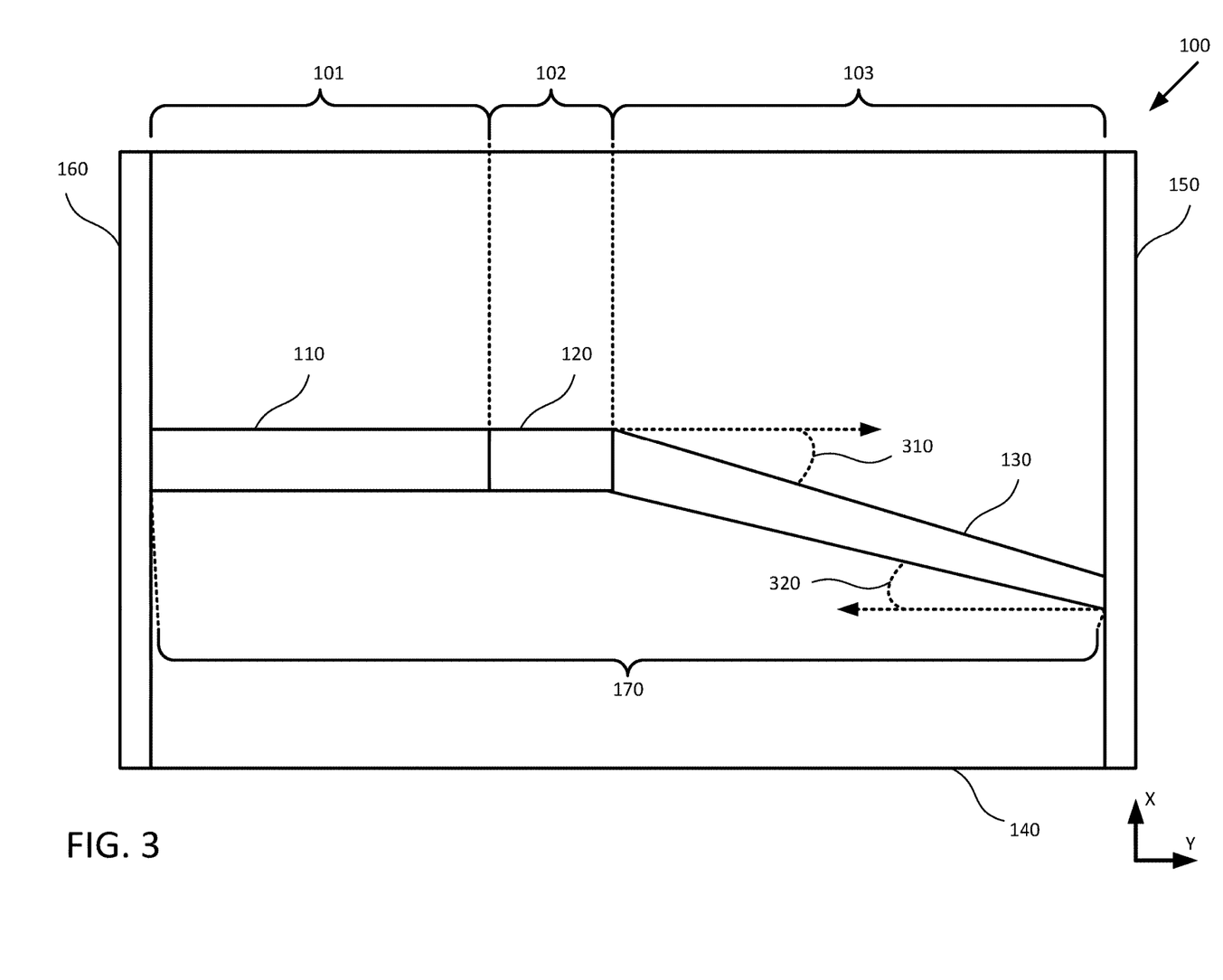
FIG. 3 illustrates a top view of a comb laser including an angled tapered waveguide, according to embodiments of the present disclosure.

FIG. 3 illustrates a top view of a comb laser 100 including an angled tapered waveguide 130, according to embodiments of the present disclosure. In various embodiments, a fabricator can position the tapered waveguide 130 at an oblique angle 310 relative to the etalon (including the laser source 110 and the reflective grating 120) and an oblique angle 320 relative to the output surface 150. Stated differently, the portion of the light path in the ridge waveguide 170 formed by the tapered waveguide 130 is neither parallel to, nor perpendicular to (i.e., is oblique to), either of the portion of the light path formed by the etalon or the output surface 150.

Figure 4:
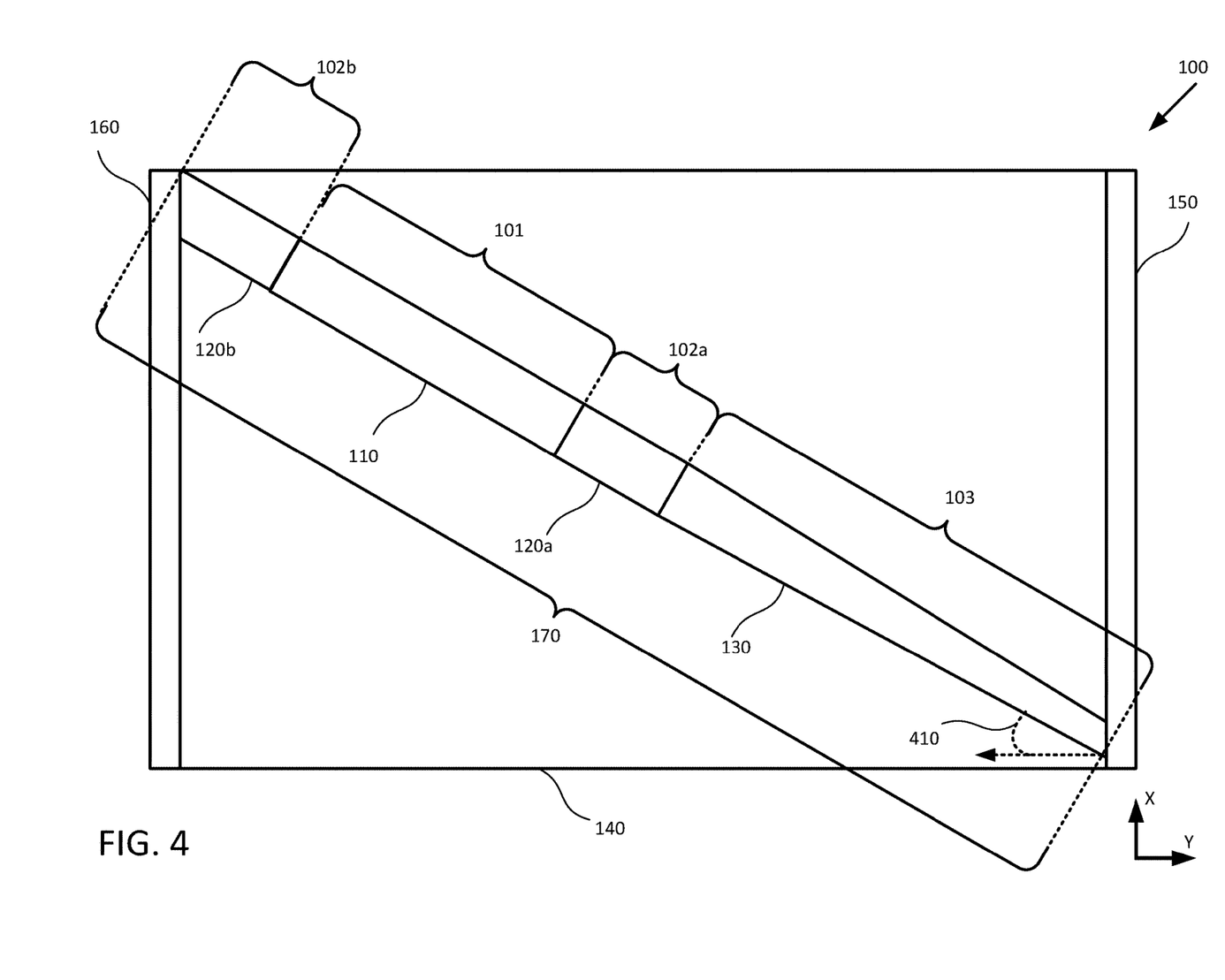
FIG. 4 illustrates a top view of a comb laser in which the upper waveguide is angled relative to the output surface, according to embodiments of the present disclosure.

FIG. 4 illustrates a top view of a comb laser 100 in which the ridge waveguide 170 is angled relative to the output surface 150, according to embodiments of the present disclosure. In various embodiments, a fabricator can position the ridge waveguide 170 at an oblique angle 410 relative to the output surface 150 and the rear surface 160. Stated differently, the ridge waveguide 170 (including the tapered waveguide 130, first reflective grating 120a, laser source 110, and second reflective grating 120b) is neither parallel to, nor perpendicular to the output surface 150.

Figure 5:
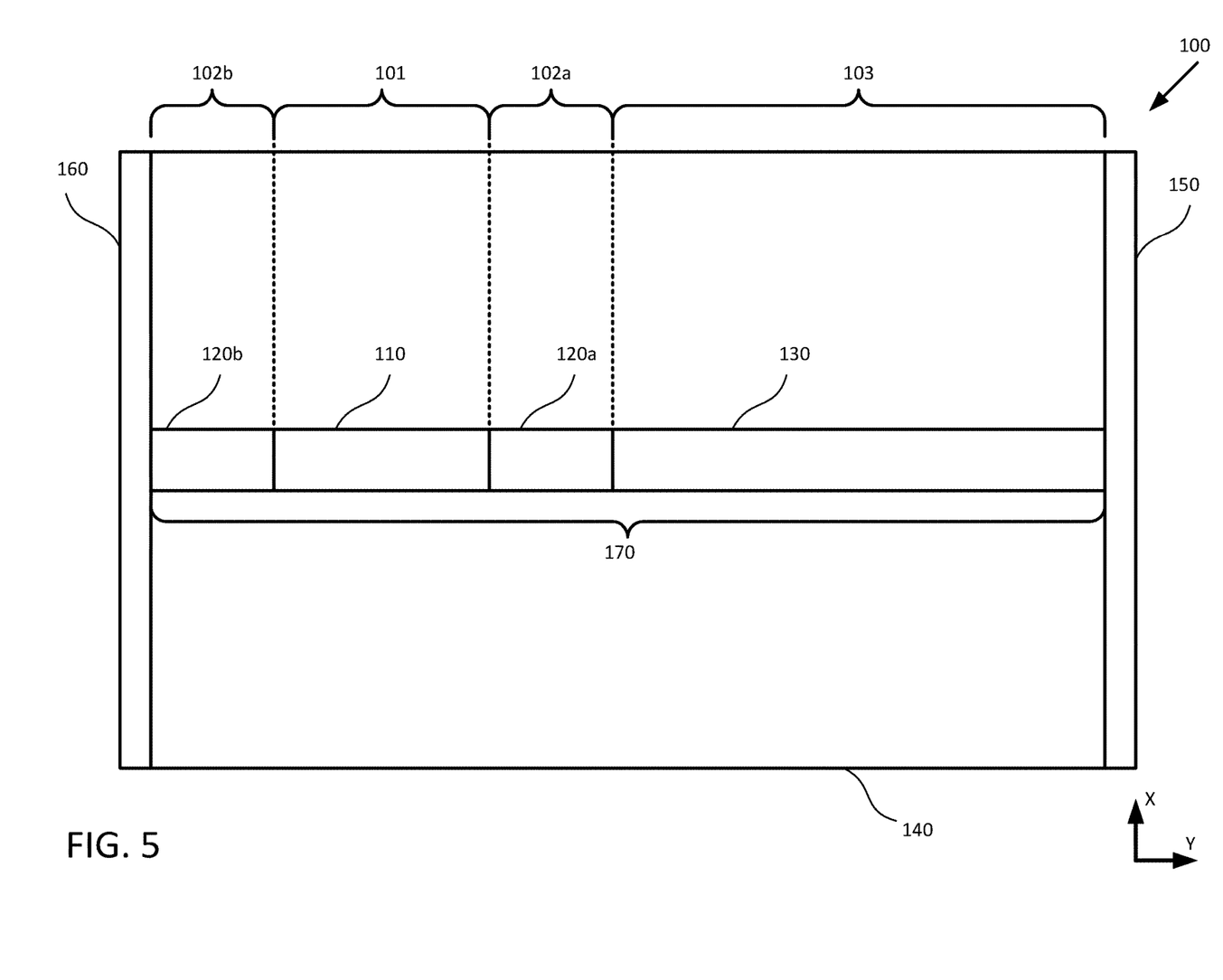
FIG. 5 illustrates a top view of a comb laser in which the tapered waveguide is optically tapered, but not physically tapered, according to embodiments of the present disclosure.

FIG. 5 illustrates a top view of a comb laser 100 in which the tapered waveguide 130 is optically tapered, but not physically tapered, according to embodiments of the present disclosure. Although various embodiments can include both optical and physical tapering, the examples provided in the Figures are generally discussed as being one of optically or physically tapered so as to not distract from the functionality provided by the tapering. When optically tapered, the apparent refractive index of the active gain medium 125 in the tapered waveguide 130 is different from that in the laser source 110, thus reflecting light (e.g., into the page in the Z direction) generated in the active gain medium 125 into the underlying lower waveguide 145 (not illustrated in FIG. 5). In various embodiments, the difference in refractive index can be constant along the length of the tapered waveguide 130 (e.g., in the Y direction) or can be gradual; more closely matching the refractive index of the laser source 110 at an upstream end than at a downstream end of the tapered waveguide 130.

Figure 6A:
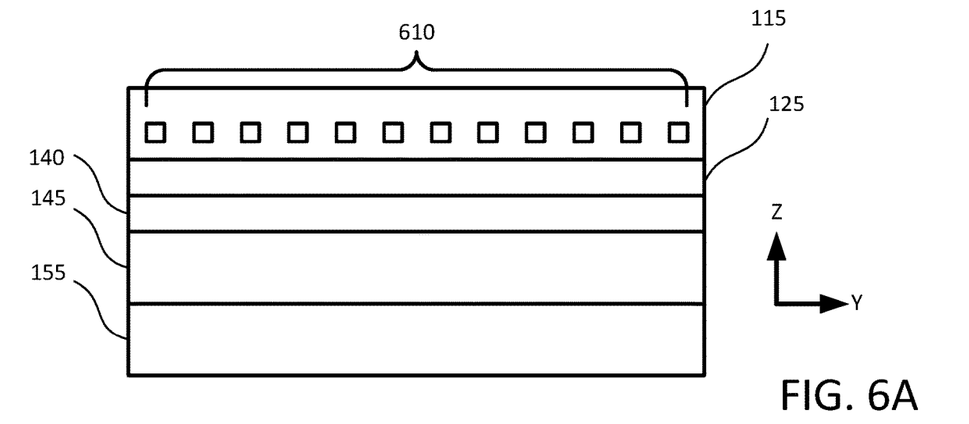
FIGS. 6A-6C illustrate details for grated reflectors, according to embodiments of the present disclosure.
Figure 6B:
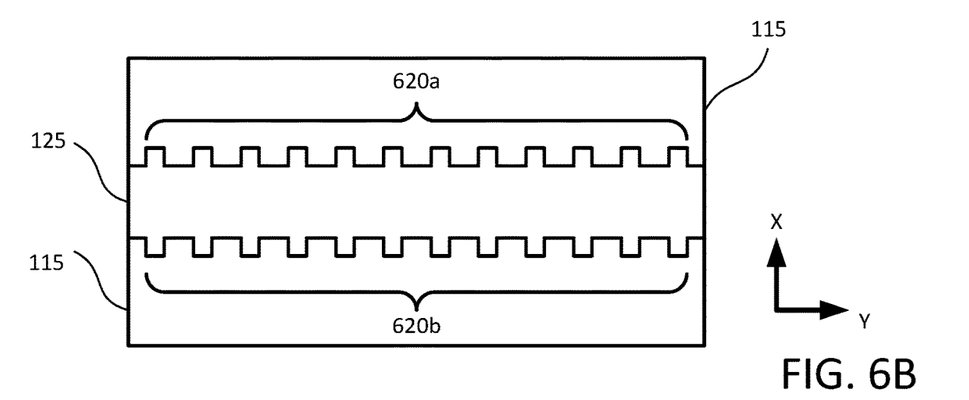
Figure 6C:
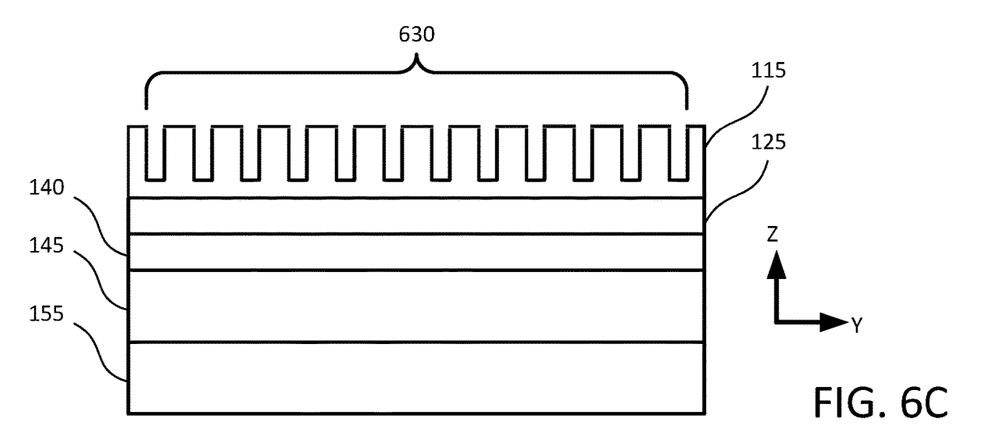

FIGS. 6A-6C illustrate details for reflective gratings 120, according to embodiments of the present disclosure. The reflective gratings 120 (whether positioned upstream or downstream from the laser source 110) are structured with a periodic variation in the apparent refractive index thereof, which causes partial reflection (and partial transmission) of optical signals transmitted to the reflective gratings 120. Various structural features with a predefined interval between features are positioned relative to the waveguide and active gain medium 125 of the reflective gratings 120, some examples of which are described in relation to FIGS. 6A-6C.

FIG. 6A illustrates a periodic variation imparted by the inclusion of waveguide inclusions 610. FIG. 6A illustrates a cross-sectional view of the reflective grating 120 in the ZY plane, where light travels generally in the Y direction through the active gain medium 125 and/or the lower waveguide 145. The lower cladding layer 155 and spacer layer 140 are shown free of the waveguide inclusions 610, similarly to how the lower cladding layer 155 and spacer layer 140 are provided in the laser source 110 and tapered waveguide 130. The upper cladding layer 115, however, includes the waveguide inclusions 610, with a substantially even spacing between the waveguide inclusions 610 that define which wavelengths of light generated by the laser source 110 are passed to the tapered waveguide 130 and which are reflected back into the laser source 110. The waveguide inclusions 610 can be made of the same material or a different material as the active gain medium 125, but do not include quantum dots, and are not part of the active gain medium 125. Stated differently, the waveguide inclusions 610 are disposed in the upper cladding layer 115, sufficiently close to the active gain medium 125 to active gain medium 125 to affect the apparent refractive index of the active gain medium 125 underlying the waveguide inclusions 610 in the Z direction, but are distinct from the active gain medium 125.

FIG. 6B illustrates a periodic variation imparted by the inclusion of waveguide crenellations 620a/620b (generally, waveguide crenellations 620) as part of the active gain medium 125. FIG. 6B illustrates a cross-sectional view of the reflective grating 120 in the XY plane, where light travels generally in the Y direction through the active gain medium 125 and/or the lower waveguide 145 (not illustrated in FIG. 6B). The waveguide crenellations 620 can increase or decrease the width in the X direction of the active gain medium 125 relative to the width of the active gain medium 125 in the laser source 110 (and/or at least an upstream portion of the tapered waveguide 130). In various embodiments, the waveguide crenellations 620 themselves can include or exclude quantum dots, despite being incorporated in the active gain medium 125.

FIG. 6C illustrates a periodic variation imparted by the inclusion of voids 630 in the upper cladding layer 115. FIG. 6C illustrates a cross-sectional view of the reflective grating 120 in the ZY plane, where light travels generally in the Y direction through the active gain medium 125 and/or the lower waveguide 145. The lower cladding layer 155 and spacer layer 140 are shown free of the waveguide voids 630, similarly to how the lower cladding layer 155 and spacer layer 140 are provided in the laser source 110 and tapered waveguide 130. The upper cladding layer 115, however, is partially etched to define the waveguide voids 630 therein, with a substantially even spacing between the waveguide inclusions 610 that define which wavelengths of light generated by the laser source 110 are passed to the tapered waveguide 130 and which are reflected back into the laser source 110. The waveguide voids 630 can remain unfilled (e.g., air-filled) or can be back filled with a different material than the upper cladding layer 115 to affect the apparent refractive index of the activate gain medium 125 underlying the waveguide voids 630 in the Z direction.

Figure 7:
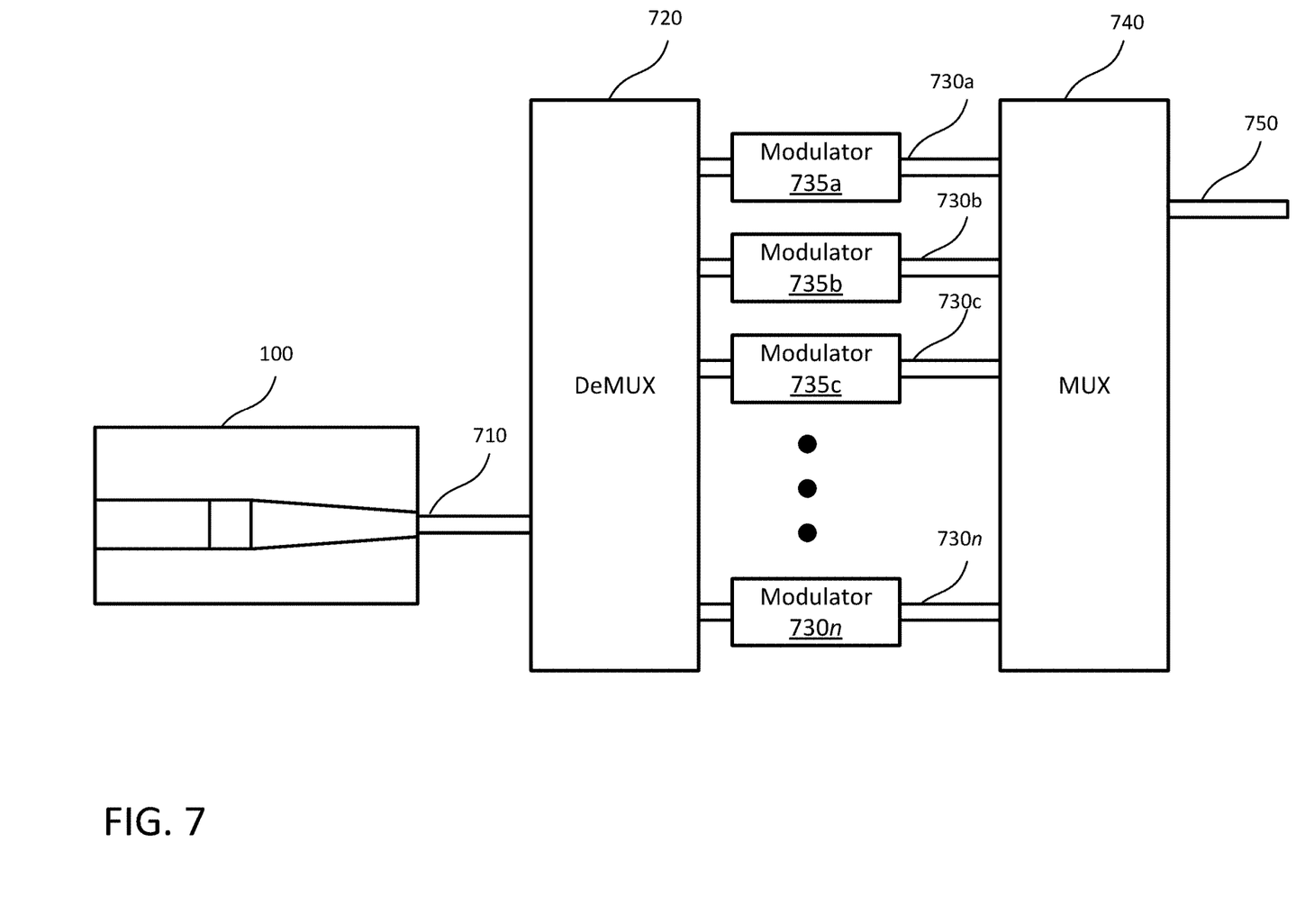
FIG. 7 illustrates a deployment scenario for a comb laser, according to embodiments of the present disclosure.

FIG. 7 illustrates a deployment scenario for a comb laser 100, according to embodiments of the present disclosure. As illustrated, the comb laser 100 is connected via a first cable 710 to an optical demultiplexer 720. The optical demultiplexer 720 receives the laser beam generated by the comb laser 100 and output via the first cable 710 and demultiplexes the laser beam; separating the individual peak wavelengths carried by the generated laser beam into different signals on different transmission pathways. In various embodiments, the different transmission pathways can include various distinct waveguides 730 (e.g., a first waveguide 730a, second waveguide 730b, third waveguide 730c, . . . nth waveguide 730n) that each include a corresponding modulator 735 (e.g., a first modulator 735a, second modulator 735b, third modulator 735c, . . . nth modulator 735n). An operator can independently modulate the demultiplexed wavelength of signal carried by each waveguide 730 by the corresponding modulator 735 to impart a data signal onto the associated wavelength.

A multiplexer 740 receives the individual wavelengths of signals carried by the individual waveguides 730, and recombines the various wavelengths on the different transmission pathways into a single signal carrying the various wavelengths and data signals modulated thereon. The multiplexer 740 outputs the single signal via an output waveguide 750, which can include solid state waveguides and/or fiber optic cables. Accordingly, the comb laser 100 generates laser beam containing a plurality of carrier waves that are substantially evenly spaced from one another than can be individually modulated to carrier data signals according to the original substantially even spacing, and are then recombined to allow for WDM on the output waveguide 750.

Figure 8:
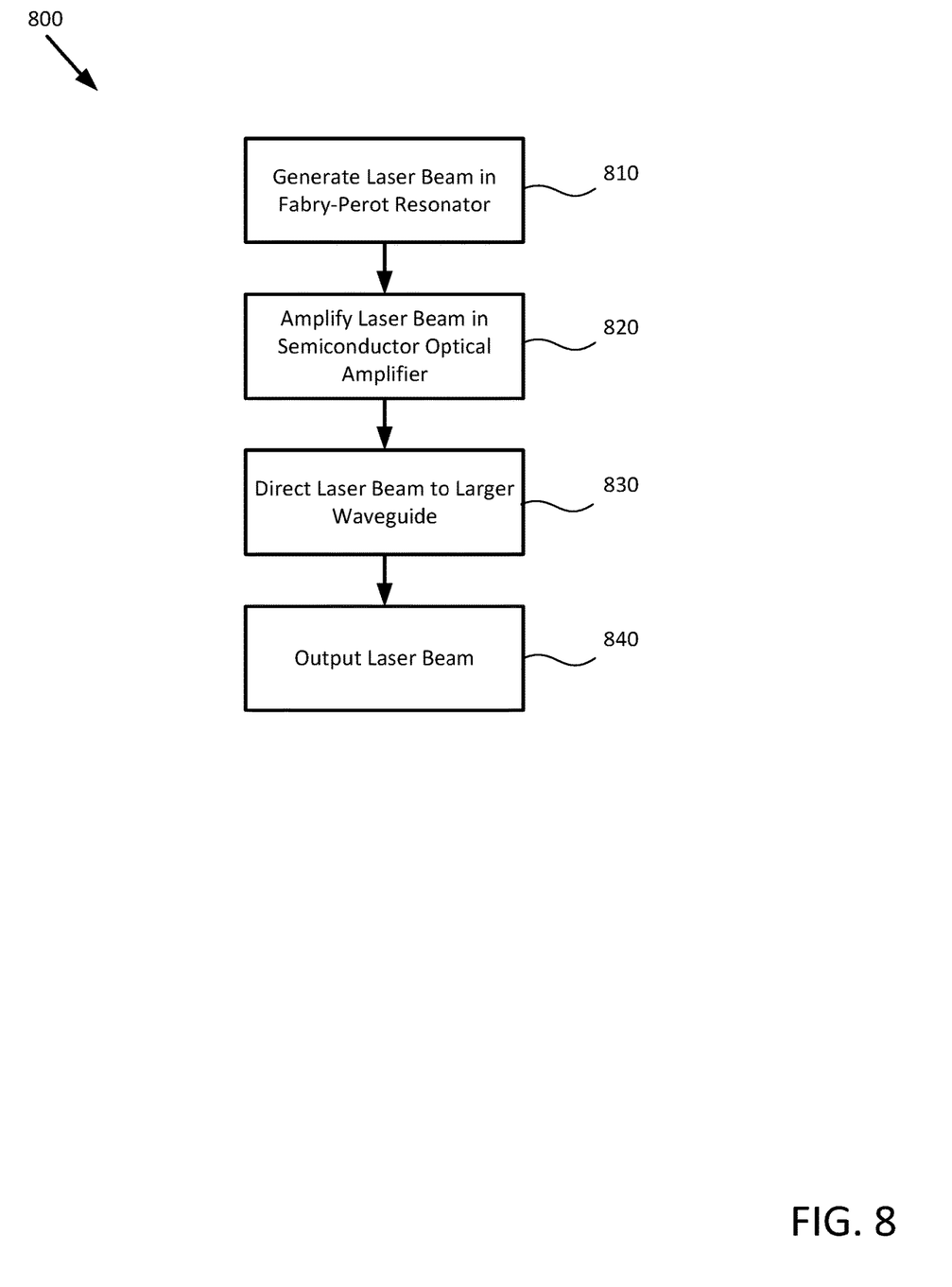
FIG. 8 is a flowchart of a method of use for a comb laser, according to embodiments of the present disclosure.

FIG. 8 is a flowchart of a method 800 of use for a comb laser 100, according to embodiments of the present disclosure. Method 800 begins with block 810, where an operator generates a laser beam having a first optical spot size via a plurality of quantum dots in a FPR. The FPR generates a laser beam including a plurality of wavelengths that are substantially evenly separated from adjacent wavelengths of the plurality of wavelengths; forming a comb pattern in the spectrum of the laser beam. The FPR includes an etalon with high gain, where the laser beam is generated, and at least one reflective grating (such as a Distributed Bragg Reflector) to selectively reflect some of the wavelengths of the laser beam back into the etalon and allow the other wavelengths to pass through. In various embodiments, the FPR includes a reflective coating on a rear surface 160 and a downstream reflective grating to define which wavelengths are passed through the FPR, while in other embodiments an upstream DBR and a downstream reflective grating are included in the FPR to define which wavelengths are passed through the FPR.

At block 820, the operator amplifies the laser beam (generated per block 810) via a tapered Semiconductor Optical Amplifier (SOA) connected to the FPR via the (downstream) reflective grating. In various embodiments, the operator can selectively control amplification of the laser beam in different regions of the SOA by varying the current injected through a corresponding region of the SOA through one or more sets of contacts.

At block 830, the operator directs the laser beam from the SOA to a second waveguide disposed under the FPR and the SOA. The second waveguide can be separated from a first waveguide including overlying FPR and SOA (e.g., a ridge waveguide) by a spacer layer of a III-V material with a lower refractive index than the first waveguides of the FPR and SOA or the second waveguide in which the laser beam is directed into. Due to the larger cross-sectional size of the second waveguide relative to the first waveguide, the laser beam expands from the first optical spot size to a second optical spot size when directed into the second waveguide. A fabricator can control the second optical spot size based on the height and width of the second waveguide (in the plane transverse to the light path) relative to the height and width of the first waveguide, the first spot optical spot size, and/or an amount of tapering in the SOA. For example, all other things being equal, an SOA with a greater overall tapering (e.g., from a first upstream cross-sectional area to a second and smaller downstream cross-sectional area) directs more of the laser beam into the second waveguide and causes greater bloom from the first optical spot size to the second optical spot size than an SOA that tapers less.

At block 840, the operator directs the laser beam out of the comb laser and into another transmission pathway. The laser beam can be directed into the air, onto a fiber optical cable, or another waveguide, but exits the comb laser as amplified by the SOA and with a second, larger, optical spot size that what the laser beam was generated at.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In view of the foregoing, the scope of the present disclosure is determined by the claims that follow.

We claim:

1. A quantum dot laser, comprising:
a first waveguide having a first width; and
a second waveguide running above the first waveguide that includes:
   a quantum dot layer;
   a first region of a second width less than the first width;
   a second region connected to the first region and comprising a reflective grating; and
   a third region connected at a first end to the second region and at a second end to an output surface wherein the third region tapers from the second width at the first end to a third width, less than the second width, at the second end.

2. The quantum dot laser of claim 1, further comprising: a spacer layer located between the first waveguide and the second waveguide.

3. The quantum dot laser of claim 1, further comprising: a reflective coating on a second surface, opposite to the output surface, wherein the first region, opposite to the second region, is connected to the reflective coating.

4. The quantum dot laser of claim 1, wherein the second waveguide further includes:
a fourth region connected to the first region opposite to the second region and including the quantum dot layer and defining a second reflective grating.

5. The quantum dot laser of claim 1, wherein the output surface includes an antireflective coating.

6. The quantum dot laser of claim 1, wherein the third region is positioned at an oblique angle relative to the second region and at an oblique angle relative to the output surface.

7. The quantum dot laser of claim 1, wherein the third region is positioned linearly to the second region and at an oblique angle relative to the output surface.

8. The quantum dot laser of claim 1, wherein the first region further comprises an electrical contact configured to apply an electrical charge for at least one of:
   forward biasing quantum dots in the quantum dot layer to create optical gain;
   activating a phase shifter included in the first region; and
   reverse biasing the quantum dots for mode-locking the quantum dot laser.

9. The quantum dot laser of claim 1, wherein the second region further comprises an electrical contact configured to apply an electrical charge to tune a reflectivity spectrum of the reflective grating.

10. The quantum dot laser of claim 1, wherein the third region further comprises an electrical contact configured to apply an electrical charge to adjust optical gain in the third region.

11. A device, comprising:
a first waveguide;
an etalon positioned above the first waveguide, the etalon having a first reflective surface and a second reflective surface, wherein the second reflective surface comprises a reflective grating configured to allow a portion of a beam of light produced by quantum dots in the etalon to pass out of the etalon at a first optical spot size, wherein the beam of light includes a plurality of wavelengths with a predefined interval between wavelengths; and
a tapered waveguide positioned above the first waveguide and connected to the reflective grating on a first end and to an output surface on a second end, wherein the tapered waveguide is configured to amplify the beam of light received from the etalon via quantum dots included in the tapered waveguide and to direct the beam of light into the first waveguide to pass out of the output surface at a second optical spot size greater than the first optical spot size.

12. The device of claim 11, wherein the first reflective surface comprises a second reflective grating.

13. The device of claim 11, wherein the tapered waveguide is positioned at an oblique angle relative to the reflective grating and at an oblique angle relative to the output surface.

14. The device of claim 11, wherein the tapered waveguide is positioned linearly to the etalon and at an oblique angle relative to the output surface.

15. The device of claim 11, wherein the tapered waveguide is physically tapered to have a first width connected to the reflective grating and a second width, less than the first width, connected to the output surface.

16. The device of claim 11, wherein the tapered waveguide is optically tapered to have a different refractive index than the etalon.

17. The device of claim 11, further comprising a spacer layer of a III-V material located between the first waveguide and both of the etalon and the tapered waveguide.

18. The device of claim 11, wherein the first waveguide has a first cross-sectional area on the output surface and the tapered waveguide has a second cross-sectional area on the output surface that is smaller than the first cross-sectional area.

19. The device of claim 11, further comprising:
a first set of electrical contacts disposed on a first side of the first waveguide, opposite to a side that the etalon and the tapered waveguide are located above; and
a second set of electrical contacts disposed above the etalon and the tapered waveguide, wherein each electrical contact of the second set of electrical contacts is paired with a corresponding electrical contact of the first set of electrical contacts to inject a current through the first waveguide and an intervening one of the etalon and the tapered waveguide.

20. A method, comprising:
generating a laser beam having a first optical spot size via a plurality of quantum dots in a Fabry-Perot Resonator (FPR), the laser beam including a plurality of wavelengths substantially evenly separated from adjacent wavelengths of the plurality of wavelengths;
amplifying the laser beam via a tapered Semiconductor Optical Amplifier (SOA) connected to the FPR via a reflective grating;
directing the laser beam from the SOA to a waveguide disposed under the FPR and the SOA, wherein the laser beam expands from the first optical spot size to a second optical spot size; and
outputting the laser beam as amplified and at the second optical spot size.

* * * * *